United States Patent [19]

Heide et al.

[11] 4,161,213

[45] Jul. 17, 1979

[54] COOLING CAPSULE FOR A THYRISTOR

[75] Inventors: Wilfried Heide, Altenberg; Friedrich Muller; Klaus Otto, both of Nuremberg; Tibor Salanki, Erlangen, all of Fed. Rep. of Germany

[73] Assignee: Siemens Aktiengesellschaft, Munich, Fed. Rep. of Germany

[21] Appl. No.: 788,595

[22] Filed: Apr. 18, 1977

[30] Foreign Application Priority Data

Apr. 23, 1976 [DE] Fed. Rep. of Germany ....... 2617776

[51] Int. Cl.$^2$ .............................................. F28F 9/22
[52] U.S. Cl. .................... 165/168; 165/80 C; 165/180; 357/82
[58] Field of Search ............... 165/80, 168, 171, 46, 165/180, 80 C, 80 E; 357/82; 361/385

[56] References Cited

U.S. PATENT DOCUMENTS

| 1,343,014 | 6/1920 | Troutman | 165/168 |
| 1,490,706 | 4/1924 | Madden | 165/168 |
| 1,884,612 | 10/1932 | Dinzl | 165/168 |
| 1,905,653 | 4/1933 | Schranz | 165/168 |
| 1,929,824 | 10/1933 | Polley | 165/168 |
| 2,837,180 | 6/1958 | Armstrong | 165/168 |
| 3,361,195 | 1/1968 | Meyerhoff et al. | 165/80 |

*Primary Examiner*—Sheldon Jay Richter
*Attorney, Agent, or Firm*—Kenyon & Kenyon

[57] ABSTRACT

A cooling capsule for a thyristor wherein the capsule is provided with a metallic core having at least one heat transfer surface and with a plurality of bores extending between surfaces of the core so as to form a meander-line-like flow path therethrough between an inlet opening and an outlet opening. The aforesaid surfaces between which the bores extend are provided with recesses each of which connects adjacent pairs of bores and the capsule is further provided with plate-like members, each of which covers a recess and is joined thereto by electron beam welding.

2 Claims, 12 Drawing Figures

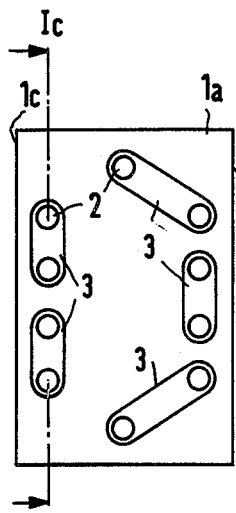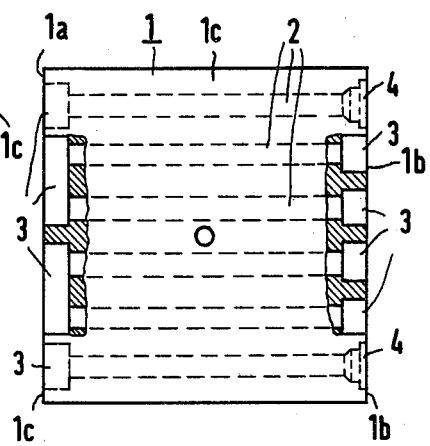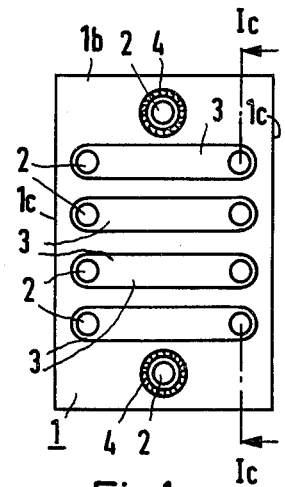
Fig.1a    Fig.1b    Fig.1c
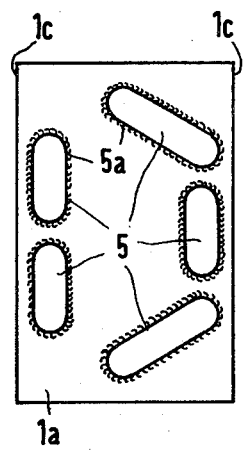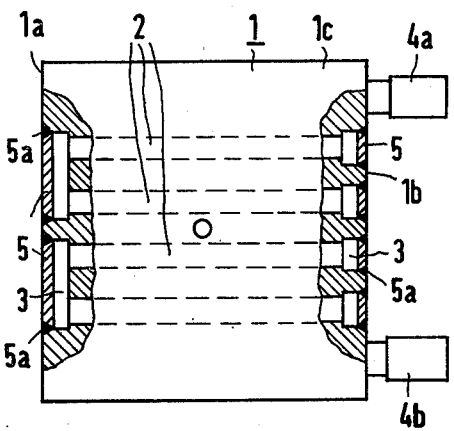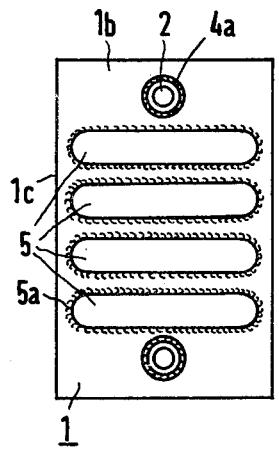
Fig.2a    Fig.2b    Fig.2c

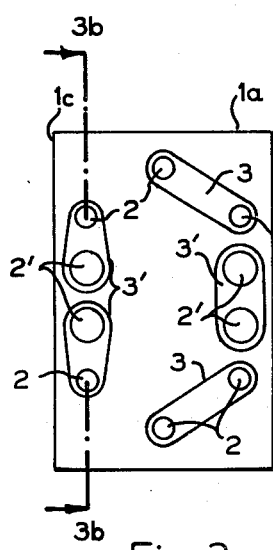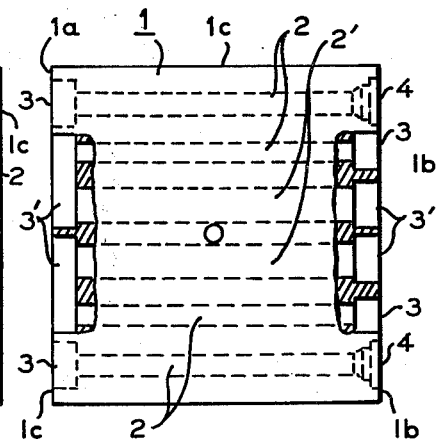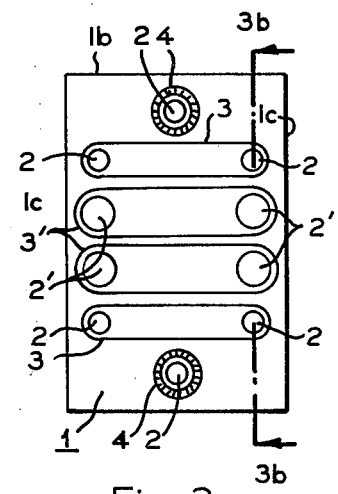
Fig. 3a  Fig. 3b  Fig. 3c
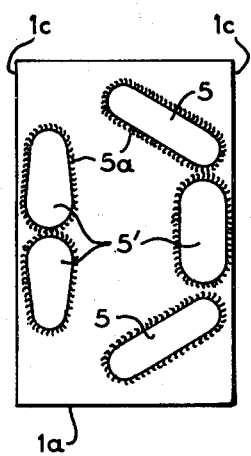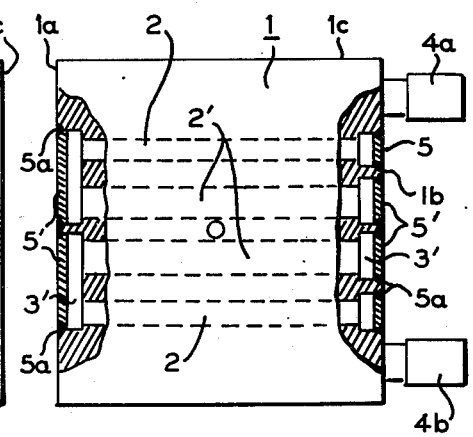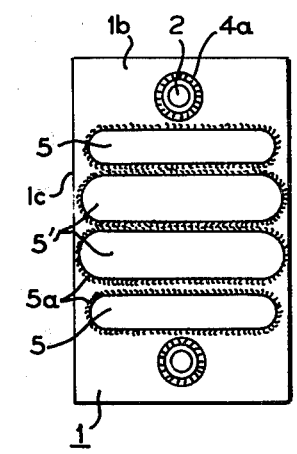
Fig. 4a  Fig. 4b  Fig. 4c

COOLING CAPSULE FOR A THYRISTOR

BACKGROUND OF THE INVENTION

1. Field of the Invention

The invention relates to a cooling capsule (heat sink) for a thyristor, and in particular, to a cooling capsule which includes at least one heat transfer surface for providing a heat-conducting connection to the thyristor, and a metallic core through which extends a flow path for carrying a cooling medium from an inlet opening to an outlet opening.

2. Description of the Product

Cooling capsules of the above type, which are used particularly for cooling disk-type thyristors, as disclosed in German Offenlegungsschrift No. 2,116,302. A typical cooling capsule is formed from a cylindrical core having opposing end faces. The inlet and the outlet openings of the capsule are situated in the end faces and the flow path is comprised of a plurality of holes or bores extending therebetween and opening into the inlet and outlet openings. The capsule is further provided with covers, each for covering one end face of the core. The surfaces of the covers facing away from the core form heat transfer surfaces for the connection to a thyristor, while the surfaces facing toward the core are provided with circular concentric slots for connecting the bores running through the core. The covers are held to the core in a liquid-tight manner by rivet connections.

The above-described cooling capsules are used for cooling individual disk-type thyristors which are clamped between two cooling capsules, or they are used in so-called thyristor columns for cooling several disk-type thyristors. In the latter case, the disk-type thyristors of the column are stacked next to each other and on each side of a disk-type thyristor, a capsule is inserted and rests with its heat transfer surface against the disk-type thyristor. Thyristor columns of the aforesaid type are disclosed, for example, in the German Offenlegungsschrift No. 1,914,790.

The components of the above-described cooling capsule can all be fabricated on a screw machine and the only further processing required is drilling of some of the components on a drill press. In spite of this far-reaching automation, the manufacture of the cooling capsules is relatively expensive. Difficulties are encountered in the fabrication of the heat transfer surfaces of the covers, which are required to be flat and plane-parallel. In general, it is necessary to subject the already riveted cooling capsule to a grinding operation to obtain suitable heat transfer surfaces. This adds a further operation to the fabrication process resulting in additional labor and machine costs.

In an attempt to avoid the above problems, a cooling capsule for a thyristor has been proposed wherein the capsule comprises a cylindrical core of heat conductive material, the latter core being provided with flow paths arranged in planes which are approximately parallel to an end face of the core forming a heat transfer surface. The flow paths are in the form of straight bores which run between two recesses disposed in opposing outer surfaces of the core and into which respective inlet and outlet openings open. The core is surrounded by a hollow, cylindrical shaped member through which extend the inlet and outlet openings. This member provides a covering for the recesses and is connected to the core in a coolant-tight manner.

In the above cooling capsule, each bore may extend along a straight path from one recess to the other. However, in the gap between the core and the hollow cylindrical member, corrosion, so-called "crevice corrosion," can occur, as it is difficult to seal this gap against entering liquid coolant.

It is an object of the present invention to provide a cooling capsule of the above type which can be easily manufactured using mass production techniques.

SUMMARY OF THE INVENTION

In accordance with the principles of the present invention, the above and other objectives are realized in a cooling capsule comprising a metallic core having at least one end surface formed as a heat transfer surface and a flow path running therethrough between an inlet and outlet opening. The flow path comprises a plurality of bores which extend between surfaces of the core and adjacent ones of which are connected through slot-shaped recesses in the aforesaid surfaces. Each recess of the capsule is covered by a separate, plate-shaped, metallic member which is joined to the core in coolant-tight manner. Preferably, the connection of each metallic member to the core in the region of its respective recess is carried out by electron-beam welding.

The above-described cooling capsule of the invention can be fabricated by cutting the core thereof from sectional material in such a manner that, after cutting, the end faces forming the heat transfer surfaces of the core are flat and plane-parallel to each other. Subsequently, bores can be run through the core via an electrochemical removal process or via a drilling process. If an electrochemical removal process is used, bores having curved paths can be realized. Preferably, each bore should extend in a straight path from one recess on one surface to another recess on the other surface, whereby a zig-zag-shaped or meander-shaped flow path is realized whose length can be varied by an appropriate line configuration of the bores.

The aforesaid recesses can be formed in the core either electrochemically or by welding. Once formed they can then be covered up by the plate-shaped metallic members via a joined coolant-tight connection. The latter coolant-tight connection can be realized by soldering, cementing or, as above indicated, preferably by electron-beam welding.

As can be appreciated, none of the steps of the above manufacturing procedure for forming the capsule of the invention require any significant labor or machine costs. Of particular importance is the obtaining of flat and plane-parallel heat transfer surfaces simply and without difficulty during the cutting process of the core. Furthermore, the use of plate-shaped metallic members to cover the recesses permits realizing coolant tight connections in a simplified manner. The capsule of the invention thus can be easily and inexpensively manufactured using mass production techniques.

Use of plate-shaped covers for the recesses is also advantageous in that they do not require sealing of gaps in the interior of the cooling capsule. Crevice corrosion, is, therefore, avoided for all practical purposes. In addition, the cooling capsule of the invention can be readily configured without redesign for a large coolant throughput of, for example, more than 10 l/min, or for a small coolant throughput of, for example, less than 2 l/min, by merely changing the bore diameters of the line configuration thereof. Moreover, through a choice of different diameters of the bores, particular regions of the heat transfer surfaces can be cooled more intensively.

The cooling capsule of the invention can be made of copper, aluminum or stainless steel, whereby it can be used at the same time for conducting the current, as is required in a series circuit of disk-type thyristors.

BRIEF DESCRIPTION OF THE DRAWINGS

The above and other features and aspects of the present invention will become more apparent upon reading the following detailed description in conjunction with the accompanying drawings, in which:

FIGS. 1a and 1c show opposing side views of a capsule in accordance with the principles of the present invention with its recesses uncovered;

FIG. 1b shows a top view of the capsule of FIGS. 1a and 1c;

FIGS. 2a and 2c show opposing side views similar to those of FIGS. 1a and 1c of a capsule in accordance with the invention with its recesses covered; and FIG. 2b illustrates a top view of the capsule of FIGS. 2a and 2c.

FIGS. 3a, 3b, 3c and 4a, 4b, and 4c are side and top views like those in FIGS. 1 and 2, showing another embodiment of the invention.

DETAILED DESCRIPTION

FIGS. 1a and 1c show views of opposite side surfaces 1a and 1b of a core 1 of a cooling capsule according to the invention in an advanced stage of manufacture. The aforesaid side surfaces extend between the heat transfer surfaces 1c of the capsule, one of the latter heat transfer surfaces being shown in FIG. 1b. As shown, the core 1 is in the shape of a parallelepiped, the latter having been cut from a sectional steel bar which was machined during the cutting process in such a manner that the heat transfer surfaces 1c are flat and plane-parallel to each other. The capsule further includes a plurality of holes or bores 2 which can be formed by drilling and which, as shown, extend in straight parallel paths from the side surface 1a to the opposite side surface 1b. Also, as shown, the bores 2 are arranged in two planes each of which is adjacent one of the respective heat transfer surfaces of the core. As can be appreciated, the cooling capsule is thereby designed for use in cooling disk-type thyristors, which are pressed against the two heat transfer surfaces of the core 1.

It should be noted that the cooling capsule of the invention can also be formed with the bores 2 following bent paths such as can be obtained if the core 1 is drilled into from different directions. In such case, the flow paths in the core can be lengthened, which allows the coolant throughput and the pressure drop in the cooling capsule to be varied. In addition, the bore diameters may be varied. In particular, the bore diameters can be enlarged, for example, in the vicinity of the center of the core in order to obtain a more intensive heat transfer there. Thus, FIGS. 3a, 3b, 3c, and 4a, 4b, 4c show the core 1 having bores 2′, recesses 3′, and plates 5′ enlarged for this purpose; in these figures the numbering of parts is otherwise the same as that of FIGS. 1a, 1b, 1c and 2a, 2b, 2c. This results in improved heat removal centrally of the core, whereby the cooling capsule is adapted, particularly, for use in the cooling of a disk-type thyristor.

The bores 2 of the core 1 are connected together via slot-shaped recesses 3 arranged in the side surfaces 1a and 1c, whereby a zig-zag-shaped or meander-shaped flow path for the coolant through the core 1 is obtained. Typically, the slots 3 can be formed in the side surfaces electrochemically of by welding in. Additionally, two or the bores 2 open into depressions 4 which serve as the respective inlet and outlet of the core.

As shown in FIG. 2b, inlet and outlet nipples 4a and 4b can be connected, for example, by welding to the depressions 4 for carrying fluid in and out of the capsule. In the present illustrative example, the nipples 4a and 4b are arranged on the same side surface 1b of the capsule.

As illustrated in FIGS. 2a and 2c, the slot-shaped recesses 3 are covered to thereby complete the flow path by steel plate-shaped members 5. The plates 5 can be cemented or soldered in the slots 3. Preferably, however, as shown in FIGS. 2a 2c, the plates 5 can be welded to their respective recesses via welded seams 5a, formed by electron-beam welding the steel plates 5 to the core 1 at the recesses 3. By so covering the individual recesses 3 with separate steel plates 5, the development of gaps which are difficult to seal and in which crevice corrosion can occur, is prevented for all practical purposes.

What is claimed is:

1. A cooling capsule for a thyristor comprising:
a core of metal having first and second opposing surfaces formed as heat transfer surfaces and third and fourth opposing surfaces transverse to said first and second surfaces, said metal core having a flow path running therethrough and an inlet opening and outlet opening connected to the flow path, said flow path comprising: first and second pluralities of bores, said first plurality of bores extending through said core adjacent said first surface and between said third and fourth surfaces, said second plurality of bores extending through said core adjacent said second surface and between said third and fourth surfaces, and said first plurality of bores being spaced from said second plurality of bores; and first and second pluralities of recesses in said third and fourth surfaces each of said first plurality of recesses connecting a pair of bores each of which is from the same plurality of bores and each of said second plurality of recesses connecting a pair of bores each of which is from a different plurality of bores;

and plate-shaped metallic members, each member arranged to cover in a coolant-tight manner one of said recesses and each member being joined to its associated recess by means of an electron-beam weld.

2. A cooling capsule in accordance with claim 1 wherein at least one of said bores has an enlarged cross-section to obtain a more intensive heat transfer.

* * * * *